(12) United States Patent
Kashiwagi et al.

(10) Patent No.: US 7,521,813 B2
(45) Date of Patent: Apr. 21, 2009

(54) SILICONE RUBBER COMPOSITION, LIGHT-EMITTING SEMICONDUCTOR EMBEDDING/PROTECTING MATERIAL AND LIGHT-EMITTING SEMICONDUCTOR DEVICE

(75) Inventors: Tsutomu Kashiwagi, Gunma-ken (JP); Toshio Shiobara, Gunma-ken (JP)

(73) Assignee: Shin-Estu Chemical Co., Ltd., Tokyo (JP)

( * ) Notice: Subject to any disclaimer, the term of this patent is extended or adjusted under 35 U.S.C. 154(b) by 1064 days.

(21) Appl. No.: 10/885,670

(22) Filed: Jul. 8, 2004

(65) Prior Publication Data

US 2005/0006794 A1 Jan. 13, 2005

(30) Foreign Application Priority Data

Jul. 9, 2003 (JP) ............... 2003-194304
Jul. 10, 2003 (JP) ............... 2003-194969

(51) Int. Cl.
*H01L 23/29* (2006.01)
*C08F 283/00* (2006.01)
(52) U.S. Cl. ............ 257/791; 525/477; 525/478
(58) Field of Classification Search ............ 525/477
See application file for complete search history.

(56) References Cited

U.S. PATENT DOCUMENTS

| | | | | |
|---|---|---|---|---|
| 3,974,122 A | * | 8/1976 | Sato et al. | 524/500 |
| 5,082,886 A | * | 1/1992 | Jeram et al. | 524/403 |
| 5,306,797 A | * | 4/1994 | Ikeno | 528/15 |
| 5,403,891 A | * | 4/1995 | Romenesko | 525/106 |
| 5,468,828 A | * | 11/1995 | Hurford et al. | 528/15 |
| 5,668,205 A | * | 9/1997 | Yoshida et al. | 524/268 |
| 5,777,047 A | * | 7/1998 | Chung et al. | 525/478 |
| 5,863,969 A | * | 1/1999 | Ward et al. | 523/213 |
| 6,124,407 A | * | 9/2000 | Lee et al. | 525/478 |
| 6,614,172 B2 | | 9/2003 | Chiu et al. | |
| 6,703,120 B1 | * | 3/2004 | Ko et al. | 428/355 R |
| 2002/0016019 A1 | * | 2/2002 | Ikeno | 438/106 |
| 2002/0145152 A1 | | 10/2002 | Shimomura | |
| 2002/0190262 A1 | | 12/2002 | Nitta et al. | |
| 2004/0043229 A1 | * | 3/2004 | Aoki et al. | 428/446 |
| 2004/0222618 A1 | * | 11/2004 | Azechi et al. | 280/728.1 |
| 2006/0057297 A1 | * | 3/2006 | Chevalier et al. | 427/387 |

FOREIGN PATENT DOCUMENTS

| | | |
|---|---|---|
| JP | 57-137355 A | 8/1982 |
| JP | 63-265956 A | 11/1988 |
| JP | 7-25987 A | 1/1995 |
| JP | 7-53872 A | 2/1995 |

(Continued)

*Primary Examiner*—Randy Gulakowski
*Assistant Examiner*—Robert Loewe
(74) *Attorney, Agent, or Firm*—Birch, Stewart, Kolasch & Birch, LLP

(57) ABSTRACT

A silicone rubber composition comprising (A) an organopolysiloxane containing at least two aliphatic unsaturated bonds, (B) an organopolysiloxane of resin structure comprising $SiO_2$ units, $R^3{}_nR^4{}_pSiO_{0.5}$ units and $R^3{}_qR^4{}_rSiO_{0.5}$ units wherein $R^3$ is vinyl or allyl, $R^4$ is a monovalent hydrocarbon group free of aliphatic unsaturation, n is 2 or 3, p is 0 or 1, n+p=3, q is 0 or 1, r is 2 or 3, q+r=3, (C) an organohydrogenpolysiloxane having at least two SiH groups, and (D) a platinum catalyst cures into a silicone rubber having excellent rubbery and strength properties and little surface tack.

7 Claims, 2 Drawing Sheets

FOREIGN PATENT DOCUMENTS

| | | |
|---|---|---|
| JP | 11-274571 A | 10/1999 |
| JP | 2000-198930 A | 7/2000 |
| JP | 2001-002922 A | 1/2001 |
| JP | 2001-217467 | 8/2001 |
| JP | 2002-314139 | 10/2002 |
| JP | 2002-314143 | 10/2002 |
| JP | 2002-327126 A | 11/2002 |
| JP | 2002-338833 A | 11/2002 |

* cited by examiner

SILICONE RUBBER COMPOSITION, LIGHT-EMITTING SEMICONDUCTOR EMBEDDING/PROTECTING MATERIAL AND LIGHT-EMITTING SEMICONDUCTOR DEVICE

TECHNICAL FIELD

This invention relates to a silicone rubber composition of the addition cure type, and more particularly, to a silicone rubber composition which cures into a silicone rubber having excellent rubbery properties and strength properties and little surface tack. It also relates to a light-emitting semiconductor embedding/protecting material which cures into a product capable of attracting little dust deposits on its surface and having a low elasticity and improved crack resistance, and a light-emitting semiconductor device comprising a light-emitting semiconductor member embedded therein.

BACKGROUND ART

Silicone rubber compositions are used in a wide variety of applications because they form cured products featuring the favorable properties of weathering and heat resistance and excellent rubbery properties such as hardness and elongation. Because of their surface tack, however, dust deposition is a problem when they are used as coatings on electric and electronic parts. See JP-A 2001-002922.

A silicone varnish which has solved the problem suffers from a crack problem. It would be desirable to have a silicone rubber composition forming a cured product which eliminates dust deposition on its surface when used in the packaging of electric and electronic parts and which has good crack resistance.

In general, it is known in the art that a cured silicone rubber composition of the addition cure type can be improved in strength by compounding a resinous organopolysiloxane. Although the compounding of a resinous organopolysiloxane is effective for enhancing the strength of a cured product, the product still maintains surface tack, posing the problem of dust deposition.

Meanwhile traditional light-emitting semiconductor devices such as light-emitting diodes (LED) are lamp-type light-emitting semiconductor devices in which a light-emitting semiconductor member is disposed on a lead electrode and encapsulated with a transparent resin to a cannonball shape as shown in FIG. 3. They are recently replaced by the "surface mount" type as a result of simplification of the mounting technology. Nowadays surface mounting light-emitting semiconductor devices as shown in FIGS. 1 and 2 become the mainstream.

In FIGS. 1 to 3, the device includes a housing 1 of glass fiber-reinforced epoxy resin, a light-emitting semiconductor member 2, lead electrodes 3 and 4, a die-bonding material 5, gold wires 6, and an embedding/protecting material 7.

While resin compositions are used for the embedment of light-emitting semiconductor members such as LED, it is required that the cured resin compositions be transparent. Then compositions comprising an epoxy resin such as a bisphenol A epoxy resin or alicyclic epoxy resin and an acid anhydride curing agent are generally used (see Japanese Patent No. 3,241,338 corresponding to JP-A 11-274571 and JP-A 7-025987).

However, these transparent epoxy resins have drawbacks including poor durability to moisture due to a high percent water absorption, poor durability to light due to a low transmittance of short wavelength light, and coloring due to photodegradation.

Under the circumstances, resin compositions comprising an organic compound having at least two carbon-to-carbon double bonds (which are reactive with SiH groups) in a molecule, a silicon compound having at least two SiH groups in a molecule, and a hydrosilylating catalyst were proposed for the embedment and protection of optical semiconductor members (see JP-A 2002-327126 and JP-A 2002-338833).

Regrettably, such silicone compositions have a drawback that when an attempt is made to improve the crack resistance, the cured composition retains surface tack so that dust readily deposits on the surface to interfere with light transmission. It was then proposed to use high-hardness silicone resins for the embedment and protection purposes (see JP-A 2002-314139 corresponding to US 2002-0145152 and JP-A 2002-314143 corresponding to US 2002-0190262).

The high-hardness silicone resins, however, are less adhesive. In an encased light-emitting semiconductor device comprising a light-emitting member disposed in a ceramic and/or plastic housing, wherein the housing interior is filled with a silicone resin, a problem arises in a thermal shock test between $-40°$ C. and $120°$ C., that the silicone resin separates from the ceramic or plastic housing.

Another problem arises from the fact that optical crystals of various compound semiconductors used in light-emitting members, such as SiC, GaAs, GaP, GaAsP, GaAlAs, InAlGaP, InGaN, and GaN, have high refractive indices. If the refractive index of embedding/protecting resin is low as in the case of dimethylsilicone resin, light is reflected at the interface between the embedding resin and the optical crystal, resulting in a lower emission efficiency.

It is then proposed to add an antireflection film as a means of enhancing the outcoupling efficiency (see JP-A 2001-246236 and JP-A 2001-217467 corresponding to U.S. Pat. No. 6,614,172). The provision of an antireflection film undesirably adds preparation steps and increases the cost.

SUMMARY OF THE INVENTION

An object of the invention is to provide a silicone rubber composition of the addition cure type that cures into a product which is improved in hardness and surface tack without sacrificing rubbery properties such as elongation.

Another object of the invention is to provide a light-emitting semiconductor embedding/protecting material which eliminates surface tack and has improved adhesion, impact resistance and high light transmittance, and a light-emitting semiconductor device embedded therein having a high emission efficiency.

We have found that when an amount of an organopolysiloxane of resin structure comprising $SiO_2$ units, $R^3{}_nR^4{}_pSiO_{0.5}$ units and $R^3{}_qR^4{}_rSiO_{0.5}$ units wherein R's are as defined later is compounded in a silicone rubber composition of the addition cure type, the hardness and surface tack of the composition are improved without sacrificing rubbery properties such as elongation. The composition prevents deposition of dust thereon. Particularly when an organopolysiloxane of the general formula (1) to be defined later having a viscosity of 10 to 1,000,000 mPa·s at $25°$ C. is combined with the organopolysiloxane of resin structure, the resulting silicone rubber composition of the addition cure type in the cured state eliminates surface tack and is low elastic, transparent, and fully adherent. The composition is thus best suited as a light-emitting semiconductor embedding/protecting material.

In one aspect, the invention provides a silicone rubber composition comprising (A) an organopolysiloxane containing at least two aliphatic unsaturated bonds in a molecule and having a viscosity of 10 to 1,000,000 mPa·s at 25° C., (B) an organopolysiloxane of resin structure comprising $SiO_2$ units, $R^3{}_nR^4{}_pSiO_{0.5}$ units and $R^3{}_qR^4{}_rSiO_{0.5}$ units wherein $R^3$ is vinyl or allyl, $R^4$ is a monovalent hydrocarbon group free of aliphatic unsaturation, n is 2 or 3, p is 0 or 1, n+p=3, q is 0 or 1, r is 2 or 3, q+r=3, component (B) being present in an amount of 20 to 70% by weight based on the total weight of components (A) and (B), (C) an organohydrogenpolysiloxane having at least two silicon atom-bonded hydrogen atoms in a molecule, and (D) a platinum group metal catalyst.

Also provided is a transparent light-emitting semiconductor embedding/protecting material comprising the silicone rubber composition defined above.

Typically, component (A) is an organopolysiloxane of the general formula (1) having a viscosity of 10 to 1,000,000 mPa·s at 25° C.

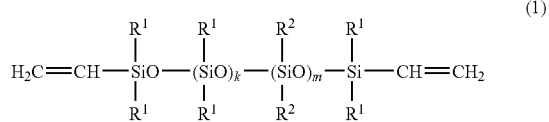

Herein $R^1$ is each independently a substituted or unsubstituted monovalent hydrocarbon group, $R^2$ is each independently a substituted or unsubstituted monovalent hydrocarbon group free of aliphatic unsaturation, k and m each are 0 or a positive integer, and k+m is such a number that the organopolysiloxane has a viscosity of 10 to 1,000,000 mPa·s at 25° C.

In a further aspect, the invention provides a light-emitting semiconductor device comprising a ceramic and/or plastic housing defining an open interior and a light-emitting semiconductor member disposed in the housing, the interior of the housing being filled with the embedding/protecting material in the cured state; and a light-emitting semiconductor device comprising a ceramic and/or plastic housing defining an open interior and a light-emitting semiconductor member disposed on lead electrodes in the housing, the interior of the housing being filled with the embedding/protecting material in the cured state.

Figure 1:
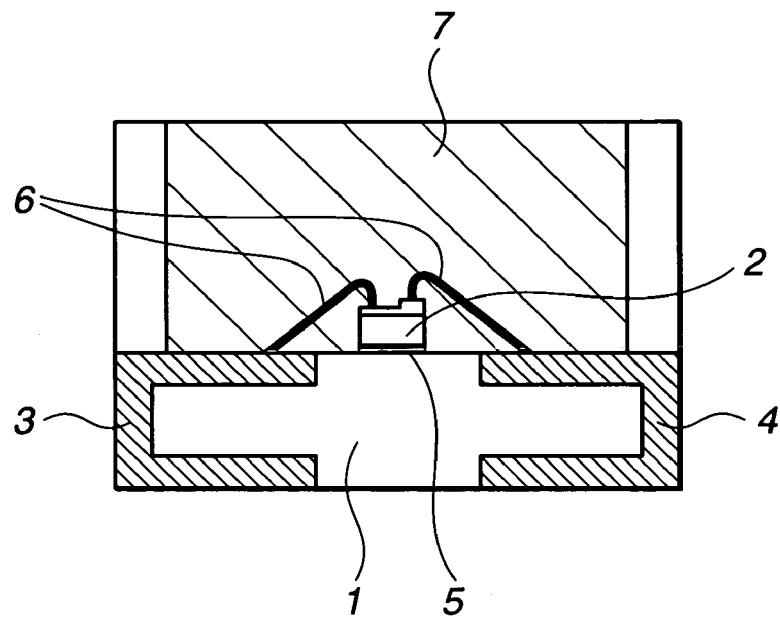
FIG. 1 is a schematic cross section of an exemplary surface mounting light-emitting semiconductor device in which a light-emitting member is die-bonded to an insulating housing.

DESCRIPTION OF THE PREFERRED EMBODIMENT (A) Organopolysiloxane

Component (A) is an organopolysiloxane which contains at least two aliphatic unsaturated bonds, typically alkenyl groups of 2 to 8 carbon atoms, especially 2 to 6 carbon atoms, such as vinyl and allyl groups, in a molecule and having a viscosity of 10 to 1,000,000 mPa·s at 25° C., especially 100 to 100,000 mPa·s at 25° C. Preferred from the working and curing standpoints is a linear organopolysiloxane of the general formula (1) containing at least one alkenyl group on the silicon atom at each of opposite ends of the molecular chain and having a viscosity of 10 to 1,000,000 mPa·s at 25° C. It is noted that the linear organopolysiloxane may contain a minor proportion of a branched structure or trifunctional siloxane units in its molecular chain.

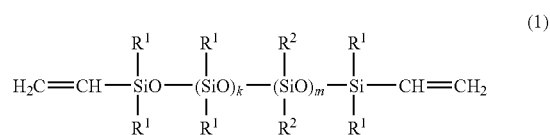

Herein $R^1$ is each-independently a substituted or unsubstituted monovalent hydrocarbon group, $R^2$ is each independently a substituted or unsubstituted monovalent hydrocarbon group free of aliphatic unsaturation, k and m each are 0 or a positive integer, and k+m is such a number that the organopolysiloxane has a viscosity of 10 to 1,000,000 mPa·s at 25° C.

The monovalent hydrocarbon groups represented by $R^1$ are preferably those of 1 to 10 carbon atoms, more preferably 1 to 6 carbon atoms, examples of which include alkyl groups such as methyl, ethyl, propyl, isopropyl, butyl, isobutyl, tert-butyl, pentyl, neopentyl, hexyl, cyclohexyl, octyl, nonyl and decyl, aryl groups such as phenyl, tolyl, xylyl and naphthyl, aralkyl groups such as benzyl, phenylethyl and phenylpropyl, alkenyl groups such as vinyl, allyl, propenyl, isopropenyl, butenyl, hexenyl, cyclohexenyl, and octenyl, and substituted forms of the foregoing groups in which some or all of the hydrogen atoms are substituted with halogen atoms (e.g., fluoro, bromo and chloro), cyano groups or the like, such as halo-substituted alkyl groups, e.g., chloromethyl, chloropropyl, bromoethyl and trifluoropropyl, and cyanoethyl.

The monovalent hydrocarbon groups represented by $R^2$ are preferably those of 1 to 10 carbon atoms, more preferably 1 to 6 carbon atoms, examples of which are as exemplified above for $R^1$, with the proviso that alkenyl groups are excluded.

The subscripts k and m are 0 or positive integers, satisfying $5 \leq k+m \leq 10,000$, preferably positive integers satisfying $10 \leq k+m \leq 2,000$ and $0 < k/(k+m) \leq 0.2$.

Illustrative examples of component (A) are given below.

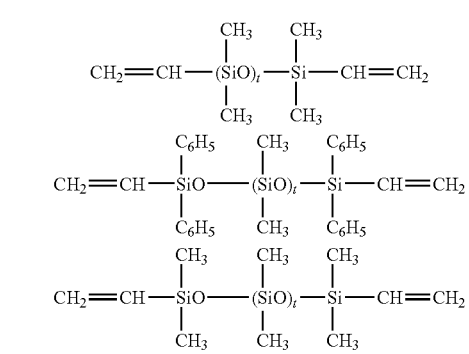

-continued

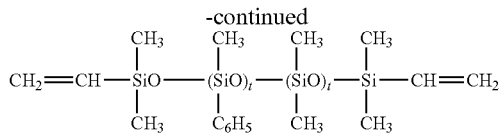

(Subscript t is an integer of 8 to 2,000.)

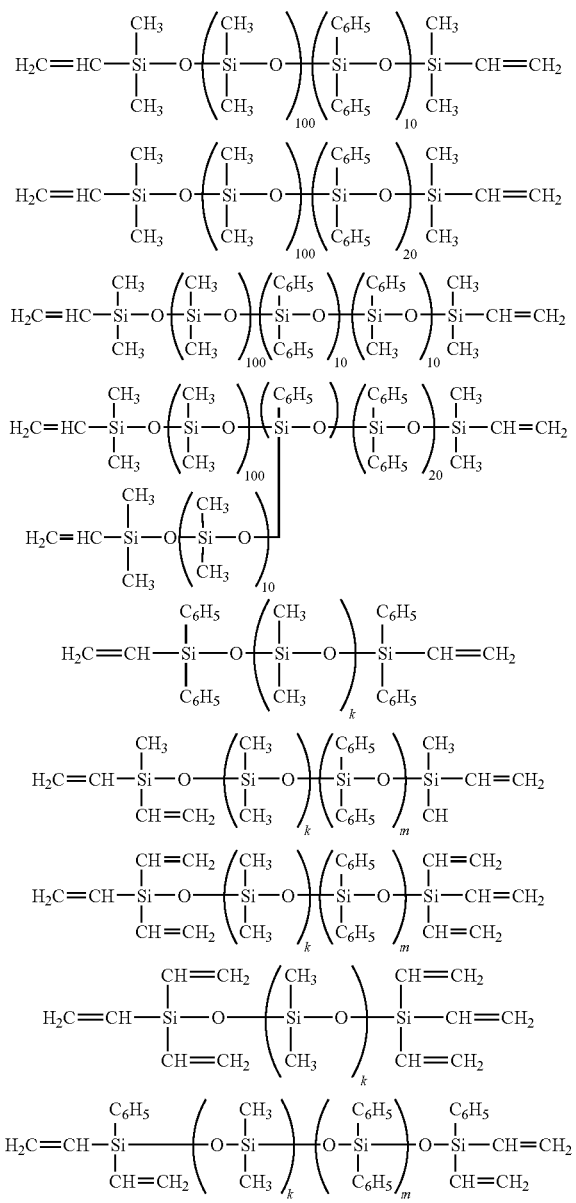

(Subscripts k and m are as defined above.)

(B) Resin Structure Organopolysiloxane

Component (B) which is essential in the inventive composition is an organopolysiloxane of resin structure or three-dimensional network structure comprising $SiO_2$ units, $R^3{}_nR^4{}_pSiO_{0.5}$ units and $R^3{}_qR^4{}_rSiO_{0.5}$ units wherein $R^3$ is vinyl or allyl, $R^4$ is a monovalent hydrocarbon group free of aliphatic unsaturation, n is 2 or 3, p is 0 or 1, n+p=3, q is 0 or 1, r is 2 or 3, and q+r=3.

The monovalent hydrocarbon groups represented by $R^4$ are preferably those of 1 to 10 carbon atoms, more preferably 1 to 6 carbon atoms, as exemplified above for $R^2$.

Provided $SiO_2$, $R^3{}_nR^4{}_pSiO_{0.5}$ and $R^3{}_qR^4{}_rSiO_{0.5}$ units are designated a, b and c units, respectively, they preferably satisfy the relationship:

$(b+c)/a$=0.3 to 3, especially 0.7 to 1, and $c/a$=0.01 to 1, especially 0.07 to 0.15, expressed in molar ratio. Also preferably, the organopolysiloxane (B) has a weight average molecular weight in the range of 500 to 10,000.

In addition to the a, b and c units, the resin structure organopolysiloxane (B) may further contain difunctional siloxane units and trifunctional siloxane units (i.e., organosilsesquioxane units) in minor amounts that will not compromise the objects of the invention.

The resin structure organopolysiloxane can be synthesized simply by combining compounds, from which the respective units are derived, in amounts to provide the desired molar proportion, and effecting cohydrolysis in the presence of an acid.

Examples of the compound from which "a" units are derived include sodium silicate, alkyl silicates, polyalkyl silicates, and silicon tetrachloride.

Examples of the compound from which "b" units are derived are given below.

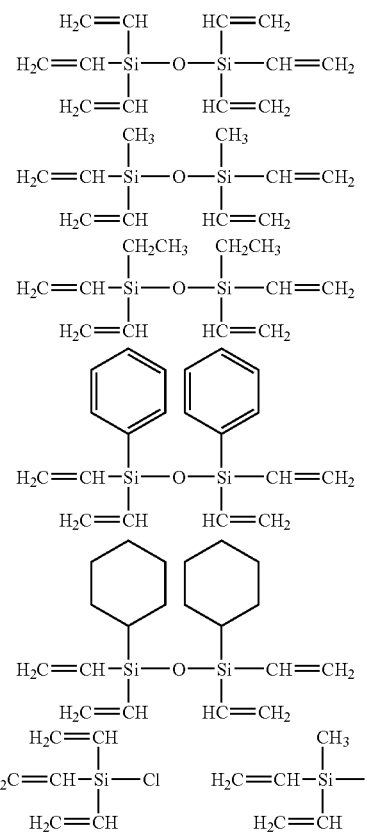

Examples of the compound from which "c" units are derived are given below.

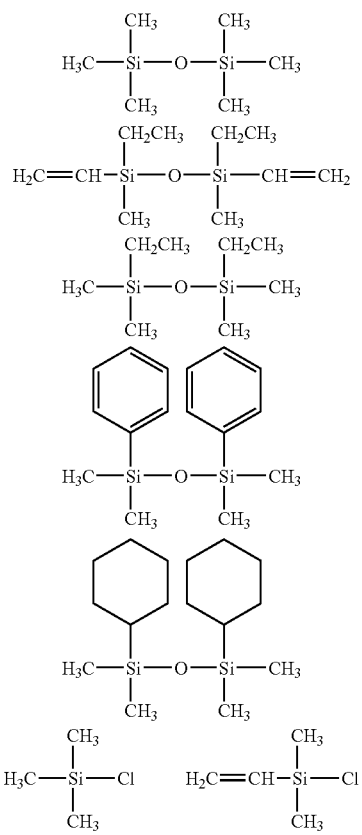

The resin structure organopolysiloxane as component (B) is compounded for the purpose of improving the physical strength and surface tack of a cured composition. Component (B) is compounded in an amount of 20 to 70% by weight, preferably 30 to 60% by weight, based on the total weight of components (A) and (B). Too less amounts of component (B) fail to achieve the desired effect whereas too much amounts of component (B) result in compositions which have an extremely high viscosity and tend to crack in the cured state.

(C) Organohydrogenpolysiloxane

Component (C) is an organohydrogenpolysiloxane which serves as a crosslinking agent for forming a cured product through addition reaction of SiH groups in component (C) to vinyl groups in components (A) and (B). Any organohydrogenpolysiloxane may be used as long as it has at least two silicon atom-bonded hydrogen atoms (i.e., SiH groups) in a molecule. Preferred is an organohydrogenpolysiloxane represented by the average compositional formula (2):

$$H_a(R^5)_b SiO_{(4-a-b)/2} \quad (2)$$

wherein $R^5$ is each independently a substituted or unsubstituted monovalent hydrocarbon group free of aliphatic unsaturation, a and b are numbers satisfying $0.001 \leq a < 2$, $0.7 \leq b \leq 2$, and $0.8 \leq a+b \leq 3$, and having at least two, preferably at least three silicon atom-bonded hydrogen atoms (i.e., SiH groups) in a molecule.

In formula (2), $R^5$ is each independently a substituted or unsubstituted monovalent hydrocarbon group free of aliphatic unsaturation, preferably having 1 to 10 carbon atoms, especially 1 to 7 carbon atoms, for example, lower alkyl groups such as methyl, aryl groups such as phenyl, and those exemplified above for $R^2$ in formula (1). The subscripts a and b are numbers satisfying $0.001 \leq a < 2$, $0.7 \leq b \leq 2$, and $0.8 \leq a+b \leq 3$, preferably $0.05 \leq a \leq 1$, $0.8 \leq b \leq 2$, and $1 \leq a+b \leq 2.7$. The position of silicon atom-bonded hydrogen atom is not critical and may be at an end or midway of the molecule.

Examples of the organohydrogenpolysiloxane include 1,1,3,3-tetramethyldisiloxane, 1,3,5,7-tetramethylcyclotetrasiloxane, both end trimethylsiloxy-capped methylhydrogenpolysiloxane, both end trimethylsiloxy-capped dimethylsiloxane-methylhydrogensiloxane copolymers, both end dimethylhydrogensiloxy-capped dimethylpolysiloxane, both end dimethylhydrogensiloxy-capped dimethylsiloxane-methylhydrogensiloxane copolymers, both end trimethylsiloxy-capped methylhydrogensiloxane-diphenylsiloxane copolymers, both end trimethylsiloxy-capped methylhydrogensiloxane-diphenylsiloxane-dimethylsiloxane copolymers, copolymers consisting of $(CH_3)_2HSiO_{1/2}$ units and $SiO_{4/2}$ units, and copolymers consisting of $(CH_3)_2HSiO_{1/2}$ units, $SiO_{4/2}$ units and $(C_6H_5)_3SiO_{3/2}$ units.

Also useful are compounds of the following structures.

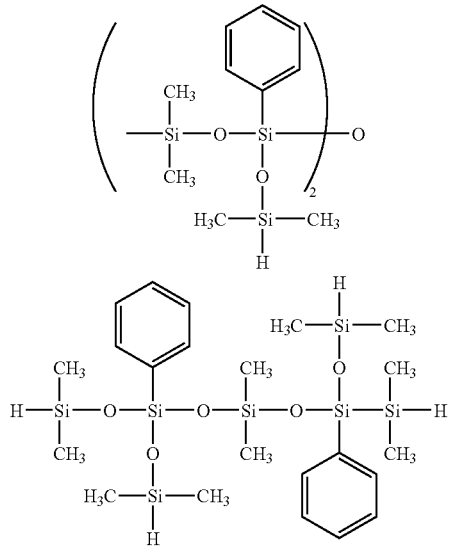

The molecular structure of the organohydrogenpolysiloxane may be either straight, branched, cyclic or three-dimensional network. The number of silicon atoms per molecule, i.e., degree of polymerization is preferably in the range of about 3 to about 1,000, more preferably about 3 to about 300.

The organohydrogenpolysiloxane can be obtained by hydrolysis of a chlorosilane such as $R^5SiHCl_2$, $(R^5)_3SiCl$, $(R^5)_2SiCl_2$ or $(R^5)_2SiHCl$ wherein $R^5$ is as defined above, and optionally equilibrating the siloxane resulting from hydrolysis.

The organohydrogenpolysiloxane (C) is compounded in an effective amount to induce curing of components (A) and (B). Preferably component (C) is used in such amounts that the molar ratio of SiH groups in component (C) to the total of alkenyl groups (typically vinyl groups) in components (A) and (B) is from 0.1 to 4.0, more preferably from 1.0 to 3.0, most preferably from 1.2 to 2.8. A molar ratio of less than 0.1 may be insufficient for curing reaction to proceed, making it difficult to obtain cured silicone rubber. At a molar ratio in excess of 4.0, a substantial amount of unreacted SiH groups may be left in the cured composition which will change its rubber physical properties with the passage of time.

(D) Platinum Group Metal Catalyst

This catalyst component is compounded for inducing addition cure reaction to the inventive composition. Platinum, palladium and rhodium base catalysts are included. Of these, platinum base catalysts such as platinum, platinum black and chloroplatinic acid are preferred from the economical standpoint. Specific examples include $H_2PtCl_6 \cdot mH_2O$, $K_2PtCl_6$, $KHPtCl_6 \cdot mH_2O$, $K_2PtCl_4$, $K_2PtCl_4 \cdot mH_2O$, and $PtO_2 \cdot mH_2O$ wherein m is a positive integer, and complexes thereof with hydrocarbons such as olefins, alcohols and vinyl-containing organopolysiloxanes. They may be used alone or in admixture. The catalyst may be used in a catalytic amount, specifically in an amount to give about 0.1 to 1,000 ppm, preferably about 0.5 to 200 ppm of platinum group metal based on the weight of components (A) to (C) combined.

(E) Adhesive Aid

In the inventive composition, adhesive aids may be optionally added for improving the adhesion of the cured composition. Suitable adhesive aids are organosilicon compounds such as organosilanes and organopolysiloxanes having a silicon atom-bonded alkoxy group. Examples of the organosilicon compounds include alkoxysilanes such as tetramethoxysilane, tetraethoxysilane, dimethyldimethoxysilane, methylphenyldimethoxysilane, methylphenyldiethoxysilane, phenyltrimethoxysilane, methyltrimethoxysilane, methyltriethoxysilane, vinyltrimethoxysilane, allyltrimethoxysilane, allyltriethoxysilane, 3-glycidoxypropyltrimethoxysilane, and 3-methacryloxypropyltrimethoxysilane as well as siloxane compounds of straight chain or cyclic structure (i.e., organosiloxane oligomers) having about 4 to about 30 silicon atoms, especially about 4 to about 20 silicon atoms and containing in a molecule at least two, preferably two or three functional groups selected from among silicon atom-bonded hydrogen atoms (SiH groups), silicon atom-bonded alkenyl groups (e.g., $Si-CH=CH_2$ groups), alkoxysilyl groups (e.g., trialkoxysilyl groups such as trimethoxysilyl), and epoxy groups (e.g., glycidoxypropyl and 3,4-epoxycyclohexylethyl).

In a preferred embodiment, organoxysilyl-modified isocyanurate compounds having the general formula (3) and/or hydrolytic condensates thereof (i.e., organosiloxane-modified isocyanurate compounds) are used as the adhesive aid.

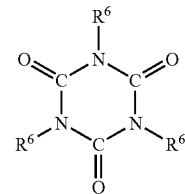

Herein $R^6$ is an organic group having the formula (4):

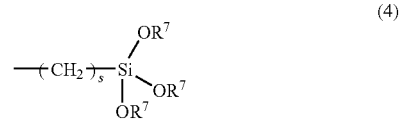

or a monovalent hydrocarbon group containing an aliphatic unsaturated bond, at least one of $R^6$ is an organic group of formula (4), $R^7$ is hydrogen or a monovalent hydrocarbon group of 1 to 6 carbon atoms, and s is an integer of 1 to 6, especially 1 to 4.

Examples of the monovalent hydrocarbon group containing an aliphatic unsaturated bond, represented by $R^6$, include alkenyl groups of 2 to 8 carbon atoms, especially 2 to 6 carbon atoms, such as vinyl, allyl, propenyl, isopropenyl, butenyl, isobutenyl, pentenyl, hexenyl, and cyclohexenyl. The monovalent hydrocarbon groups represented by $R^7$ include those of 1 to 8 carbon atoms, preferably 1 to 6 carbon atoms, for example, alkyl groups such as methyl, ethyl, propyl, isopropyl, butyl, isobutyl, tert-butyl, pentyl, hexyl and cyclohexyl, alkenyl groups such as vinyl, allyl, propenyl and isopropenyl as exemplified above for $R^6$, and aryl groups such as phenyl. Of these, alkyl groups are preferred.

Illustrative examples of the adhesive aid (E) are given below.

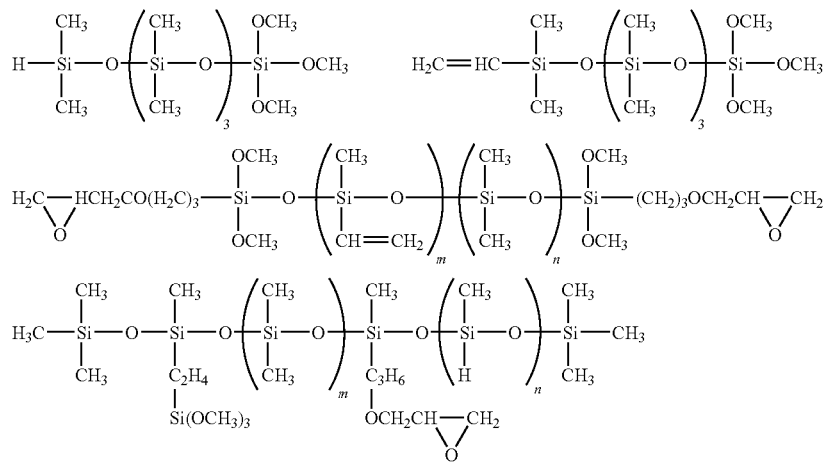

(Subscripts m and n are positive integers satisfying m+n=2 to 50, preferably 4 to 20.)

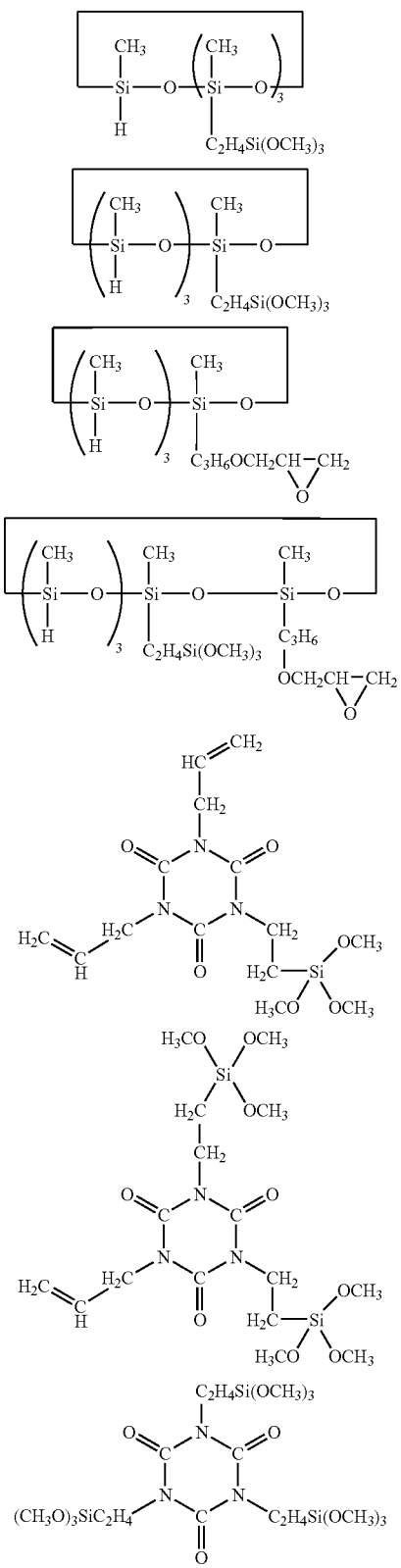

Of the organosilicon compounds as component (E), those organosilicon compounds having silicon atom-bonded alkoxy groups and silicon atom-bonded alkenyl groups or silicon atom-bonded hydrogen atoms (i.e., SiH groups) in a molecule are preferred because the cured compositions are more adhesive.

The adhesive aid as optional component (E) is included in an amount of 0 to about 10 parts by weight, preferably about 0.01 to 5 parts by weight, more preferably about 0.1 to 1 part by weight, per 100 parts by weight of components (A) and (B) combined. Too less amounts of component (E) may fail to achieve the desired effect whereas too much amounts of component (E) may adversely affect the hardness and surface tack of a cured composition.

It is noted that the silicone rubber composition of the invention is useful as a light-emitting semiconductor embedding/protecting material. When an adhesive aid is incorporated as described above, the inventive silicone rubber composition, by virtue of a high bonding force, never undergoes separation upon resin curing or IR reflow during mounting operation. Since the cured composition has little or no surface tack, little or no dust deposits on the surface thereof. Since the cured composition has a Durometer Type A hardness of up to 75 and low elasticity, it can absorb the stresses induced by a difference in coefficient of thermal expansion from the ceramic or plastic housing. Then the cured composition develops no cracks even after 1,000 cycles of a thermal shock test between a low temperature of −40° C. and a high temperature of 120° C.

In addition to components (A) to (E), the inventive composition may further contain per se known various additives, if necessary. Suitable additives include reinforcing inorganic fillers such as fumed silica and fumed titanium dioxide, and non-reinforcing inorganic fillers such as calcium carbonate, calcium silicate, titanium dioxide, ferric oxide, carbon black and zinc oxide. These additives may be added in suitable amounts of up to 600 parts by weight per 100 parts by weight of components (A) and (B) combined.

The silicone rubber composition of the invention is prepared by intimately mixing the components. Most often, the composition is shelf stored in two divided form so as to prohibit the progress of cure. On use, two parts are mixed together whereupon cure takes place. It is, of course, possible to formulate a one-part composition by adding minor amounts of reaction inhibitors such as acetylene alcohol compounds, triazoles, nitrile compounds or phosphorus compounds to the composition for extending the pot-life. It is also acceptable to add phosphors for wavelength alteration, light scattering agents such as finely divided titanium oxide ($TiO_2$) or the like to the inventive silicone rubber composition.

The inventive composition quickly cures, if necessary, by heating, to form an elastomer having a high hardness and no surface tack. Thus the composition is useful in various applications where the tackiness of silicone should be avoided, for example, as protective coatings on electric and electronic parts, typically surface coatings on silicone rubber keyboards, and potting compounds, casting compounds, and molding compounds.

The curing conditions are not particularly limited. Usually the composition can be cured by heating at about 60 to 200° C., preferably about 80 to 180° C. for about 5 minutes to 8 hours, preferably about 10 minutes to 4 hours.

It is noted that the inventive silicone rubber composition can be prepared in liquid form. Particularly when used as a light-emitting semiconductor embedding/protecting material, the composition is preferably liquid at room temperature. Specifically, it preferably has a viscosity at 25° C. of about 10 to 1,000,000 mPa·s, especially about 100 to 1,000,000 mPa·s.

Figure 2:
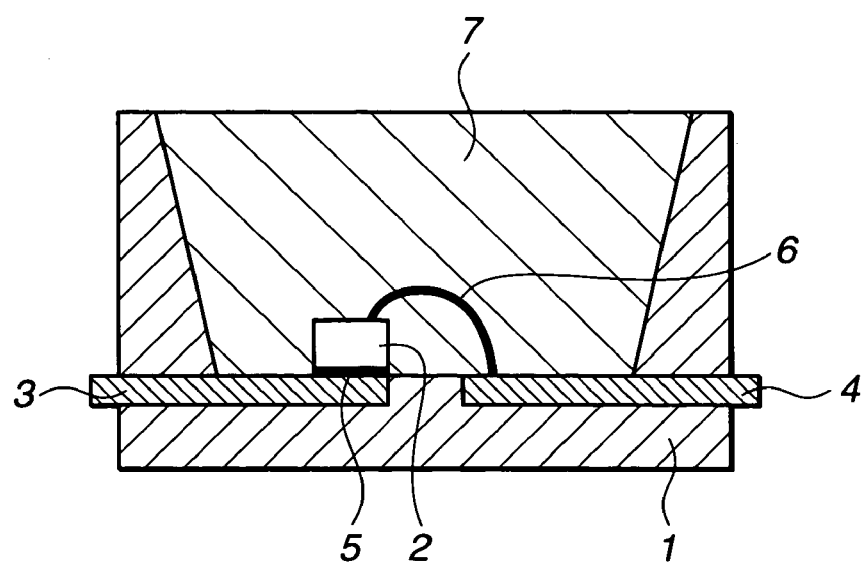
FIG. 2 is a schematic cross section of another exemplary surface mounting light-emitting semiconductor device in which a light-emitting member is die-bonded to lead electrodes inserted through a housing.
Figure 3:
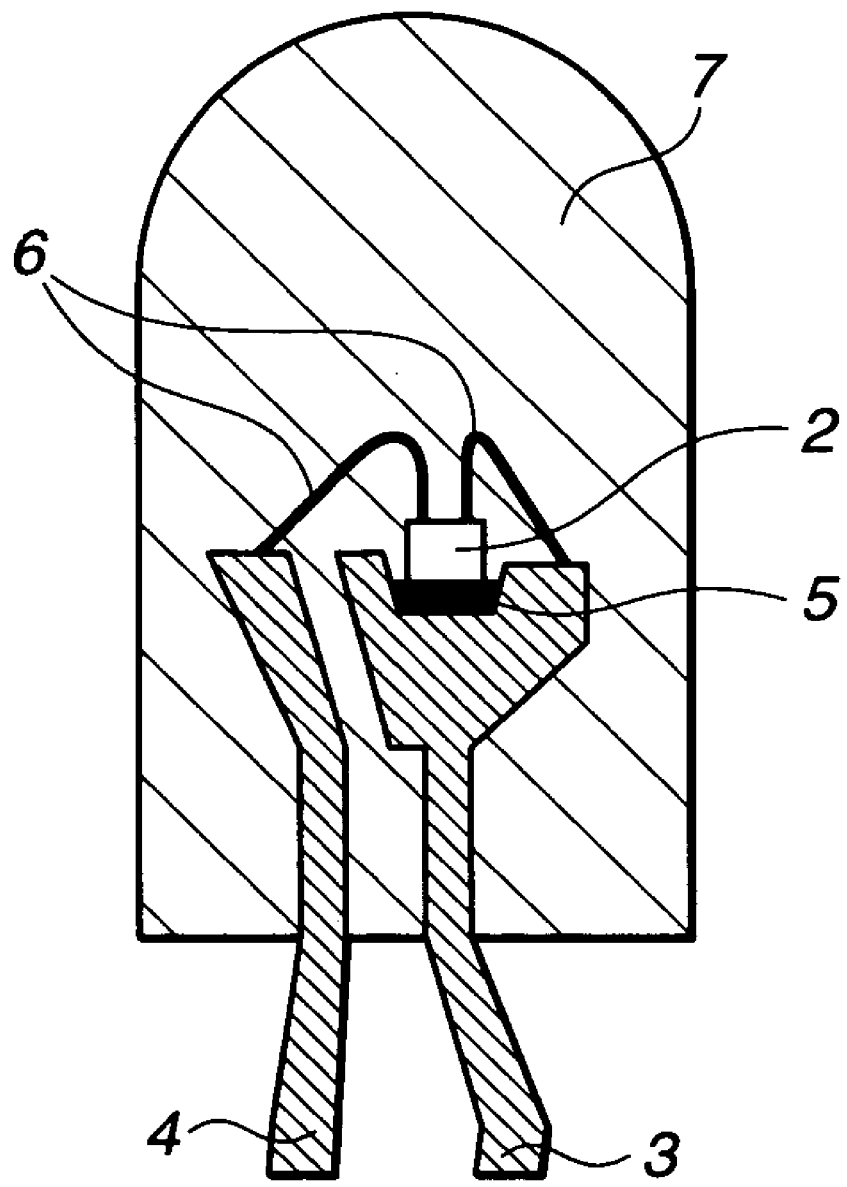
FIG. 3 is a schematic cross section of an LED as a lamp type light-emitting semiconductor device.

The embedding/protecting material of the invention is used for the embedment and protection of light-emitting semiconductor members. The light-emitting semiconductor members to which the invention is applicable include light-emitting diodes (LED), organic electroluminescent devices (organic EL), laser diodes, and LED arrays. It is not critical how to embed light-emitting semiconductor members. In a typical procedure, as shown in FIGS. 1 and 2, a light-emitting semiconductor member 2 is disposed in an open interior of a housing 1, the interior is filled with the embedding/protecting material 7 so as to surround the light-emitting semiconductor member 2, and the material is cured.

For the inventive embedding/protecting material, the curing conditions may be selected from a wide range from about 72 hours at room temperature (25° C.) to about 3 minutes at 200° C. and in accordance with working conditions. An appropriate set of conditions may be determined by taking a balance with productivity and the heat resistance of a light-emitting semiconductor member and a housing.

EXAMPLE

Examples of the invention are given below by way of illustration and not by way of limitation. All parts are by weight. The viscosity is a measurement at 25° C. Me is methyl and Vi is vinyl.

Example 1

A silicone rubber composition was prepared by combining 50 parts of a polysiloxane (VF) having formula (i), 50 parts of a resin structure vinylmethylsiloxane (VMQ) consisting of 50 mol % $SiO_2$ units, 42.5 mol % $(CH_3)_3SiO_{0.5}$ units and 7.5 mol % $Vi_3SiO_{0.5}$ units, an organohydrogenpolysiloxane having formula (ii) in an amount to give 1.5 mol of SiH groups per mol of vinyl groups in the VF and VMQ components, and 0.05 part of an octyl alcohol-modified chloroplatinic acid solution and intimately mixing them.

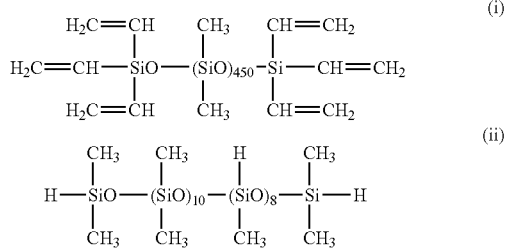

The composition was heat molded at 150° C. for 4 hours to form a cured sample, which was measured for tensile strength, hardness (by Type A spring tester) and elongation according to JIS K-6301. The surface tack of the sample was tested by finger touch. The surface tack was also examined by placing the sample in a cotton dust atmosphere, taking out, and blowing air to the surface to see whether dust deposits were blown off the surface. Separately, the composition was cast into an aluminum dish having a diameter of 6 cm and a depth of 0.6 mm and cured therein to form a sample, which was subjected to a thermal cycling test between −50° C. and 150° C. whereupon cracks were inspected. The results are shown in Table 1.

Example 2

A silicone rubber composition was prepared as in Example 1 except that a polysiloxane (VF) having formula (iii) was used. The composition was cured into samples, which were tested as in Example 1. The results are also shown in Table 1.

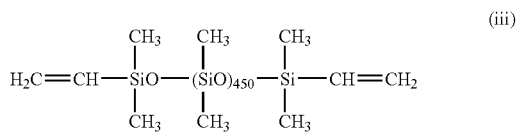

Example 3

A silicone rubber composition was prepared as in Example 1, aside from using 70 parts of VF, 30 parts of VMQ (VF and VMQ containing 0.043 mol/100 g of SiVi bonds in total), 4.3 parts of the organohydrogenpolysiloxane (containing 0.74 mol/100 g of SiH groups), and 0.05 part of the octyl alcohol-modified chloroplatinic acid solution. The composition was cured into samples, which were tested as in Example 1. The results are also shown in Table 1.

Example 4

A silicone rubber composition was prepared as in Example 1, aside from replacing the VMQ resin by 50 parts of a resin structure vinylmethylsiloxane (VMQ) consisting of 50 mol % $SiO_2$ units, 42.5 mol % $(CH_3)_3SiO_{0.5}$ units and 7.5 mol % $Vi_2MeSiO_{0.5}$ units, and using the organohydrogenpolysiloxane having formula (ii) in an amount to give 1.5 mol of SiH groups per mol of vinyl groups in the VF and VMQ components. The composition was cured into samples, which were tested as in Example 1. The results are also shown in Table 1.

Example 5

A silicone rubber composition was prepared by combining 50 parts of the polysiloxane (VF) having formula (i), 50 parts of a resin structure vinylmethylsiloxane (VMQ) consisting of 50 mol % $SiO_2$ units, 40 mol % $(CH_3)_3SiO_{0.5}$ units and 10 mol % $Vi_3SiO_{0.5}$ units, the organohydrogenpolysiloxane having formula (ii) in an amount to give 1.5 mol of SiH groups per mol of vinyl groups in the VF and VMQ components, and 0.05 part of the octyl alcohol-modified chloroplatinic acid solution and intimately mixing them. The composition was heat molded at 150° C. for 4 hours to form a cured sample, which was tested as in Example 1. The results are also shown in Table 1.

Comparative Example 1

A silicone rubber composition was prepared by combining 50 parts of the polysiloxane (VF) having formula (iii), 50 parts of a resin structure vinylmethylsiloxane (VMQ) consisting of 50 mol % $SiO_2$ units, 42.5 mol % $(CH_3)_3SiO_{0.5}$ units and 7.5 mol % $ViMe_2SiO_{0.5}$ units, the organohydrogenpolysiloxane having formula (ii) in an amount to give 1.5 mol of SiH groups per mol of vinyl groups in the VF and VMQ components, and 0.05 part of the octyl alcohol-modified chloroplatinic acid solution and intimately mixing them. The composition was heat molded at 150° C. for 4 hours to form a cured sample, which was tested as in Example 1. The results are also shown in Table 2.

Comparative Example 2

A silicone rubber composition was prepared by combining 50 parts of the polysiloxane (VF) having formula (i), 50 parts of a resin structure vinylmethylsiloxane (VMQ) consisting of 50 mol % $SiO_2$ units, 42.5 mol % $(CH_3)_3SiO_{0.5}$ units and 7.5 mol % $ViMe_2SiO_{0.5}$ units, the organohydrogenpolysiloxane having formula (ii) in an amount to give 1.5 mol of SiH groups per mol of vinyl groups in the VF and VMQ components, and 0.05 part of the octyl alcohol-modified chloroplatinic acid solution and intimately mixing them. The composition was heat molded at 150° C. for 4 hours to form a cured sample, which was tested as in Example 1. The results are also shown in Table 2.

Comparative Example 3

A commercially available silicone varnish KJR-632 (Shin-Etsu Chemical Co., Ltd.) was similarly cured into a cured sample, which was tested as in Example 1. The results are also shown in Table 2.

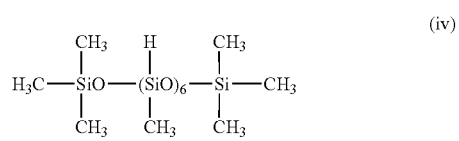

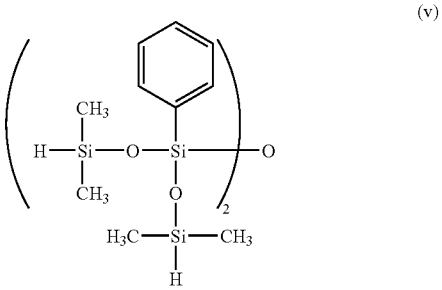

TABLE 1

| | Example | | | | |
|---|---|---|---|---|---|
| | 1 | 2 | 3 | 4 | 5 |
| SiH/SiVi | 1.5 | 1.5 | 1.5 | 1.5 | 1.5 |
| Curing conditions | 150° C./4 hr | 150° C./4 hr | 150° C./4 hr | 150° C./4 hr | 150° C./4 hr |
| Hardness (Type A) | 88 | 86 | 70 | 90 | 95 |
| Elongation (%) | 30 | 30 | 30 | 30 | 15 |
| Tensile strength (MPa) | 6 | 7 | 7 | 8 | 7 |
| Dust deposition due to surface tack | nil | nil | slight | nil | nil |
| −50° C./150° C. thermal shock test, 1000 cycles | no crack | no crack | no crack | no crack | no crack |

TABLE 2

| | Comparative Example | | |
|---|---|---|---|
| | 1 | 2 | 3 |
| SiH/SiVi | 1.5 | 1.5 | 1.5 |
| Curing conditions | 150° C./4 hr | 150° C./4 hr | 150° C./4 hr |
| Hardness (Type A) | 70 | 72 | 80 (Shore D) |
| Elongation (%) | 30 | 30 | — |
| Tensile strength (MPa) | 6 | 7 | — |
| Dust deposition due to surface tack | deposited | deposited | nil |
| −50° C./150° C. thermal shock test, 1000 cycles | no crack | no crack | cracked at 2 cycles |

Example 6

A silicone rubber composition was prepared by combining 50 parts of the polysiloxane (VF) having formula (i), 50 parts of a resin structure vinylmethylsiloxane (VMQ) consisting of 50 mol % $SiO_2$ units, 42.5 mol % $(CH_3)_3SiO_{0.5}$ units and 7.5 mol % $Vi_3SiO_{0.5}$ units, 8 parts of an organohydrogenpolysiloxane having formula (iv), 5 parts of an organohydrogenpolysiloxane having formula (v), 0.3 part of an adhesive aid having formula (vi), and 0.05 part of an octyl alcohol-modified chloroplatinic acid solution and intimately mixing them.

-continued

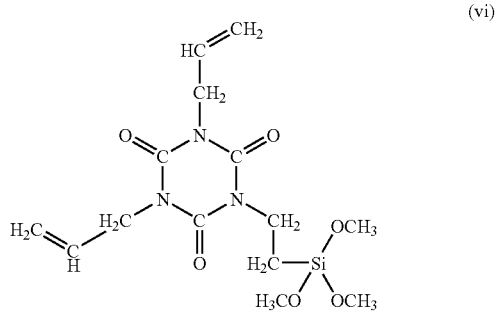

The composition was heat molded at 150° C. for 4 hours to form a cured sample, which was measured for shear bond strength to aluminum, hardness (by Type A spring tester) and elongation according to JIS K-6301. The surface tack of the sample was tested by finger touch. The surface tack was also examined by placing the sample in a cotton dust atmosphere, taking out, and blowing air to the surface to see whether dust deposits were blown off the surface. Separately, the composition was cast into an aluminum dish having a diameter of 6 cm and a depth of 0.6 mm and cured therein to form a sample, which was subjected to a thermal cycling test between −50° C. and 150° C. whereupon cracks were inspected. The results are shown in Table 3.

Example 7

A silicone rubber composition was prepared as in Example 6 except that the polysiloxane (VF) having formula (iii) was used. The composition was cured into samples, which were tested as in Example 6. The results are also shown in Table 3.

Example 8

A silicone rubber composition was prepared by combining 50 parts of the polysiloxane (VF) having formula (i), 50 parts of a resin structure vinylmethylsiloxane (VMQ) consisting of 50 mol % $SiO_2$ units, 40 mol % $(CH_3)_3SiO_{0.5}$ units and 10 mol % $Vi_3SiO_{0.5}$ units, 3 parts of the organohydrogenpolysiloxane having formula (ii), 5 parts of the organohydrogenpolysiloxane having formula (iv), 0.2 part of an adhesive aid having formula (vii), and 0.05 part of the octyl alcohol-modified chloroplatinic acid solution and intimately mixing them.

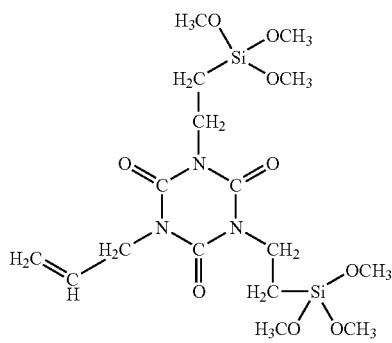
(vii)

The composition was molded at 150° C. for 4 hours to form a cured sample, which was tested as in Example 6. The results are also shown in Table 3.

Comparative Example 4

A silicone rubber composition was prepared by combining 50 parts of the polysiloxane (VF) having formula (iii), 50 parts of a resin structure vinylmethylsiloxane (VMQ) consisting of 50 mol % $SiO_2$ units, 42.5 mol % $(CH_3)_3SiO_{0.5}$ units and 7.5 mol % $ViMe_2SiO_{0.5}$ units, 8 parts of the organohydrogenpolysiloxane having formula (iv), 5 parts of the organohydrogenpolysiloxane having formula (v), 0.3 part of the adhesive aid having formula (vi), and 0.05 part of the octyl alcohol-modified chloroplatinic acid solution and intimately mixing them. The composition was molded at 150° C. for 4 hours to form a cured sample, which was tested as in Example 6. The results are also shown in Table 3.

Comparative Example 5

A silicone rubber composition was prepared by combining 50 parts of the polysiloxane (VF) having formula (i), 50 parts of a resin structure vinylmethylsiloxane (VMQ) consisting of 50 mol % $SiO_2$ units, 42.5 mol % $(CH_3)_3SiO_{0.5}$ units and 7.5 mol % $ViMe_2SiO_{0.5}$ units, 3 parts of the organohydrogenpolysiloxane having formula (ii), 5 parts of the organohydrogenpolysiloxane having formula (iv), 0.2 part of the adhesive aid having formula (vii), and 0.05 part of the octyl alcohol-modified chloroplatinic acid solution and intimately mixing them. The composition was molded at 150° C. for 4 hours to form a cured sample, which was tested as in Example 6. The results are also shown in Table 3.

TABLE 3

|  | Example | | | Comparative Example | |
| --- | --- | --- | --- | --- | --- |
|  | 6 | 7 | 8 | 4 | 5 |
| Curing conditions | 150° C./4 hr | 150° C./4 hr | 150° C./4 hr | 150° C./4 hr | 150° C./4 hr |
| Hardness (Type A) | 87 | 88 | 95 | 70 | 71 |
| Elongation (%) | 30 | 30 | 15 | 30 | 30 |
| Shear bond strength (MPa) | 2.0 | 1.9 | 2.1 | 1.8 | 1.7 |
| Dust deposition due to surface tack | nil | nil | nil | deposited | deposited |
| −50° C./150° C. thermal shock test, 1000 cycles | no crack | no crack | no crack | no crack | no crack |

The test results demonstrate that the cured compositions of the invention have excellent impact resistance and eliminate the drawback of silicone elastomer that dust deposits due to surface tack.

The following examples refer to the transparent light-emitting semiconductor embedding/protecting material.

First described are tests for evaluating embedding/protecting materials of Examples and Comparative Examples.

Tests

[Preparation of Silicone Base Die-bonding Material]

A silicone base die-bonding material was prepared by intimately mixing 100 parts of a vinyldimethylsiloxy-terminated dimethylsiloxane/diphenylsiloxane copolymer (viscosity 3 Pa·s) having formula (I), 2.5 parts of a methylhydrogenpolysiloxane (viscosity 15 mPa·s) having formula (II), 0.03 part of a 2-ethylhexyl alcohol-modified chloroplatinic acid solution (Pt concentration 2 wt %), 0.05 part of ethynylcyclohexyl alcohol, 7 parts of 3-glycidoxypropyltrimethoxysilane, and 400 parts of spherical alumina fine powder having an average particle diameter of 9 μm.

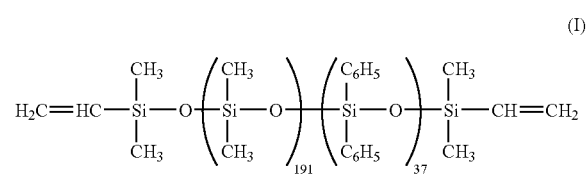
(I)

-continued

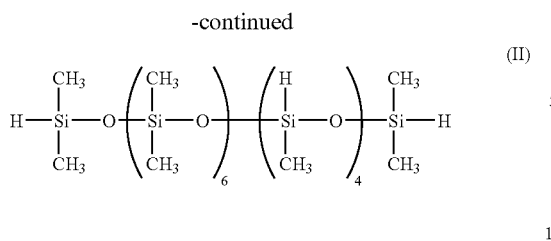
(II)

[Fabrication of Light-emitting Semiconductor Device]

A light-emitting semiconductor device as shown in FIG. 1 was fabricated. An LED chip including an emissive layer of InGaN and having a main emission peak at 470 nm was used as a light-emitting member 2. The light-emitting member 2 was secured to a housing 1 of glass fiber-reinforced epoxy resin having a pair of lead electrodes 3 and 4, by using the silicone base die-bonding material 5 and heating at 180° C. for 10 minutes. Gold wires 6 were bonded to the light-emitting member 2 and the lead electrodes 3 and 4 for electrical connection. An embedding/protecting material 7 was potted into the interior of the housing 1 and cured at 180° C. for one hour, completing a light-emitting semiconductor device.

[Thermal Shock Test]

On the light-emitting semiconductor device fabricated above, a thermal shock test of cooling to −40° C. and heating to 120° C. was performed 1,000 cycles. The outer appearance of samples was inspected for cracks, the number of cracked samples being reported.

[Dust Deposition on Surface]

Silica powder was sprayed on the light-emitting semiconductor device fabricated above so that silica particles deposited on the surface. Air was blown to the device surface to see whether silica particles were blown off the surface.

Example 9

A silicone rubber composition was prepared by combining 50 parts of a polysiloxane (VF) having formula (i), 50 parts of a resin structure vinylmethylsiloxane (VMQ) consisting of 50 mol % $SiO_2$ units, 42.5 mol % $(CH_3)_3SiO_{0.5}$ units and 7.5 mol % $Vi_3SiO_{0.5}$ units, 8 parts of an organohydrogenpolysiloxane having formula (iv), 5 parts of an organohydrogenpolysiloxane having formula (v), 0.3 part of an adhesive aid having formula (vi), and 0.05 part of an octyl alcohol-modified chloroplatinic acid solution and intimately mixing them.

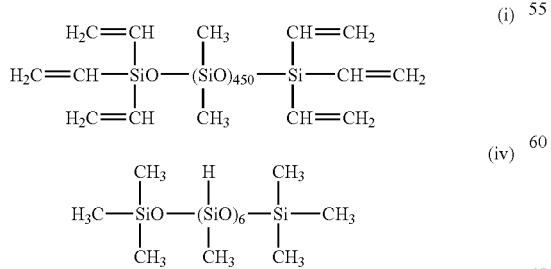
(i)

(iv)

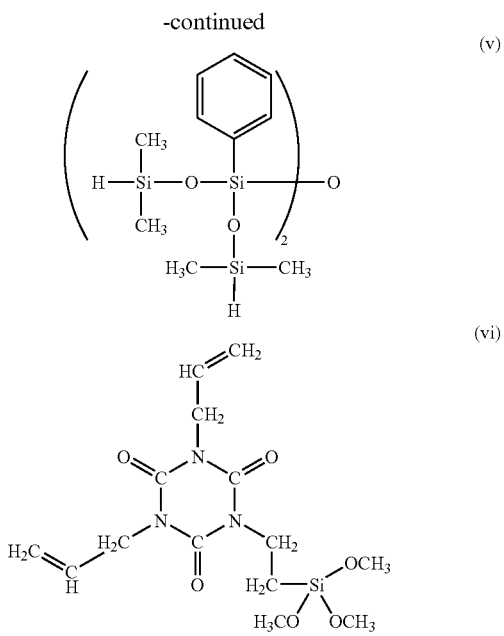
(v)

(vi)

The composition was heat molded at 150° C. for 4 hours to form a cured sample, which was measured for hardness (by Type A spring tester) according to JIS K-6301. The cured sample was colorless and transparent. The results are also shown in Table 4. Using the rubber composition, a light-emitting semiconductor device was fabricated as above.

Example 10

A silicone rubber composition was prepared as in Example 9 except that a polysiloxane (VF) having formula (iii) was used. The composition was cured into samples, which were tested as in Example 9. The results are also shown in Table 4. The cured sample was colorless and transparent. Using the rubber composition, a light-emitting semiconductor device was fabricated as above.

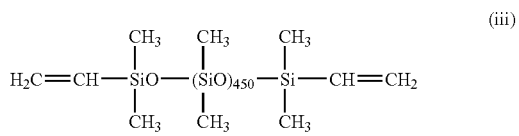
(iii)

Example 11

A silicone rubber composition was prepared as in Example 9, aside from using 70 parts of the polysiloxane (VF), 30 parts of a resin structure vinylmethylsiloxane (VMQ) consisting of 50 mol % $SiO_2$ units, 42.5 mol % $(CH_3)_3SiO_{0.5}$ units and 7.5 mol % $Vi_2MeSiO_{0.5}$ units, and 10 parts of an organohydrogenpolysiloxane of formula (ii). The composition was cured into samples, which were tested as in Example 9. The results are also shown in Table 4. The cured sample was colorless and transparent. Using the rubber composition, a light-emitting semiconductor device was fabricated as above.

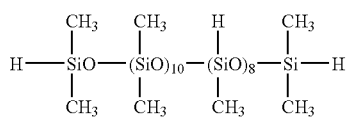
(ii)

Example 12

A silicone rubber composition was prepared by combining 50 parts of a polysiloxane (VF) having formula (i), 50 parts of a resin structure vinylmethylsiloxane (VMQ) consisting of 50 mol % $SiO_2$ units, 40 mol % $(CH_3)_3SiO_{0.5}$ units and 10 mol % $Vi_3SiO_{0.5}$ units, 8 parts of an organohydrogenpolysiloxane having formula (ii), 5 parts of an organohydrogenpolysiloxane having formula (iv), 0.2 part of an adhesive aid having formula (vii), and 0.05 part of an octyl alcohol-modified chloroplatinic acid solution and intimately mixing them.

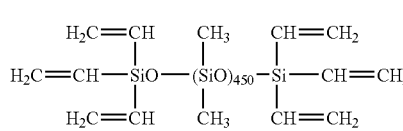
(i)

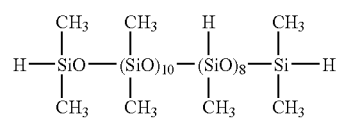
(ii)

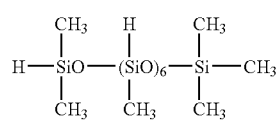
(iv)

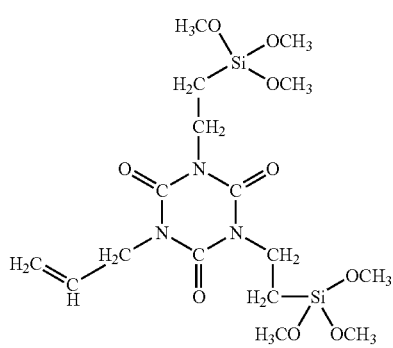
(vii)

The composition was heat molded at 150° C. for 4 hours into a cured sample, which was tested as in Example 9. The results are also shown in Table 4. The cured sample was colorless and transparent. Using the rubber composition, a light-emitting semiconductor device was fabricated as above.

Comparative Example 6

A silicone rubber composition was prepared by combining 50 parts of a polysiloxane (VF) having formula (iii), 50 parts of a resin structure vinylmethylsiloxane (VMQ) consisting of 50 mol % $SiO_2$ units, 42.5 mol % $(CH_3)_3SiO_{0.5}$ units and 7.5 mol % $ViMe_2SiO_{0.5}$ units, 8 parts of an organohydrogenpolysiloxane having formula (iv), 5 parts of an organohydrogenpolysiloxane having formula (v), 0.3 part of an adhesive aid having formula (vi), and 0.05 part of an octyl alcohol-modified chloroplatinic acid solution and intimately mixing them.

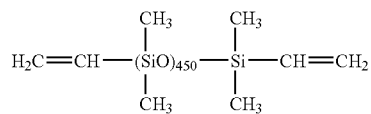
(iii)

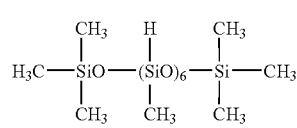
(iv)

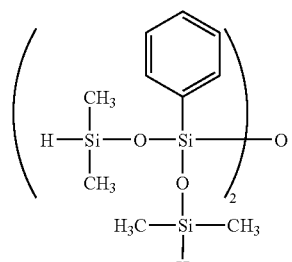
(v)

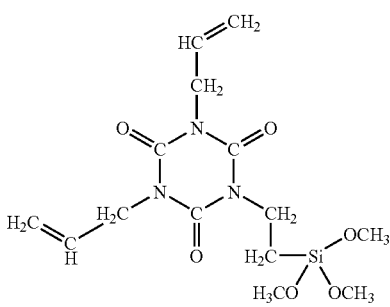
(vi)

The composition was heat molded at 150° C. for 4 hours into a cured sample, which was tested as in Example 9. The results are also shown in Table 4. The cured sample was colorless and transparent. Using the rubber composition, a light-emitting semiconductor device was fabricated as above.

Comparative Example 7

A silicone rubber composition was prepared by combining 50 parts of a polysiloxane (VF) having formula (i), 50 parts of a resin structure vinylmethylsiloxane (VMQ) consisting of 50 mol % $SiO_2$ units, 42.5 mol % $(CH_3)_3SiO_{0.5}$ units and 7.5 mol % $ViMe_2SiO_{0.5}$ units, 3 parts of an organohydrogenpolysiloxane having formula (ii), 5 parts of an organohydrogenpolysiloxane having formula (iv), 0.2 part of an adhesive aid having formula (vii), and 0.05 part of an octyl alcohol-modified chloroplatinic acid solution and intimately mixing them.

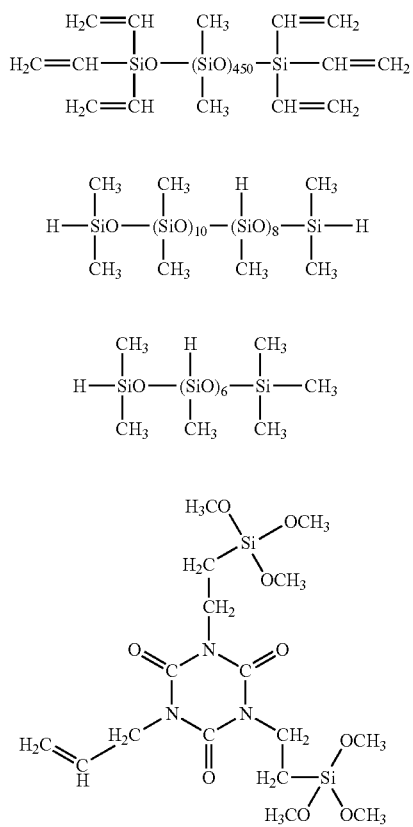

The composition was heat molded at 150° C. for 4 hours into a cured sample, which was tested as in Example 9. The results are also shown in Table 4. The cured sample was colorless and transparent. Using the rubber composition, a light-emitting semiconductor device was fabricated as above.

Comparative Example 8

A commercially available silicone varnish KJR-632 (Shin-Etsu Chemical Co., Ltd.) was similarly cured into a cured sample, which was tested as in Example 9. The results are also shown in Table 4. The cured sample was colorless and transparent. Using the varnish, a light-emitting semiconductor device was fabricated as above.

Using the silicone rubber compositions and varnish of Examples 9 to 12 and Comparative Examples 6 to 8, light-emitting semiconductor members were encapsulated. Device properties were evaluated.

Table 4 shows the test results of the embedding/protecting materials of Examples and Comparative Examples.

TABLE 4

|  | Example | | | | Comparative Example | | |
|---|---|---|---|---|---|---|---|
|  | 9 | 10 | 11 | 12 | 6 | 7 | 8 |
| Hardness (Durometer type A) | 85 | 87 | 72 | 92 | 73 | 72 | (80)* |
| Dust deposition | nil | nil | nil | nil | deposited | deposited | nil |
| Thermal shock test (cracked samples) | 0/50 | 0/50 | 0/50 | 0/50 | 0/50 | 0/50 | 50/50 |

*Shore D hardness

The light-emitting semiconductor device in which the light-emitting semiconductor member is embedded and protected with the material of the invention undergoes little discoloration and maintains a high emission efficiency in the heating tests. The invention that offers a light-emitting semiconductor device featuring a long life and energy saving is of great industrial worth.

Japanese Patent Application Nos. 2003-194304 and 2003-194969 are incorporated herein by reference.

The invention has been described in detail with particular reference to preferred embodiments thereof, but it will be understood by those skilled in the art that variations and modifications can be effected within the spirit and scope of the invention.

The invention claimed is:

1. A silicone rubber composition comprising
   (A) an organopolysiloxane containing at least two aliphatic unsaturated bonds in a molecule and having a viscosity of 10 to 1,000,000 mPa·s at 25° C.,
   (B) an organopolysiloxane of resin structure comprising $SiO_2$ units, $R^3{}_nR^4{}_pSiO_{0.5}$ units and $R^3{}_qR^4{}_rSiO_{0.5}$ units wherein $R^3$ is vinyl or allyl, $R^4$ is a monovalent hydrocarbon group free of aliphatic unsaturation, n is 2 or 3, p is 0 or 1, n+p=3, q is 0 or 1, r is 2 or 3, q+r=3,
   (C) an organohydrogenpolysiloxane having at least two silicon atom-bonded hydrogen atoms in a molecule, and
   (D) a platinum group metal catalyst,
   component (B) being present in an amount of 20 to 70% by weight based on the total weight of components (A) and (B).

2. The silicone rubber composition of claim 1, wherein component (A) is an organopolysiloxane having the general formula (1):

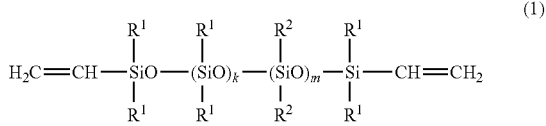

wherein $R^1$ is each independently a substituted or unsubstituted monovalent hydrocarbon group, $R^2$ is each independently a substituted or unsubstituted monovalent hydrocarbon group free of aliphatic unsaturation, k and m each are 0 or a positive integer, and k+m is such a number that the organopolysiloxane has a viscosity of 10 to 1,000,000 mPa·s at 25° C.

3. The silicone rubber composition of claim 1, further comprising (E) an adhesive aid.

4. The silicone rubber composition of claim 3, wherein the adhesive aid (E) is an isocyanurate compound having the general formula (3):

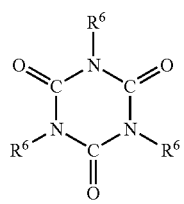

(3)

wherein $R^6$ is an organic group having the formula (4):

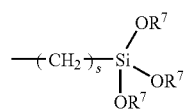

(4)

or a monovalent hydrocarbon group containing an aliphatic unsaturated bond, at least one of $R^6$ is an organic group of formula (4), $R^7$ is hydrogen or a monovalent hydrocarbon group of 1 to 6 carbon atoms, and s is an integer of 1 to 6, or a hydrolytic condensate thereof or both.

5. A transparent light-emitting semiconductor embedding/protecting material comprising the silicone rubber composition of claim 1.

6. A light-emitting semiconductor device comprising a ceramic and/or plastic housing defining an open interior and a light-emitting semiconductor member disposed in the housing, the interior of the housing being filled with the embedding/protecting material of claim 5 in the cured state.

7. A light-emitting semiconductor device comprising a ceramic and/or plastic housing defining an open interior and a light-emitting semiconductor member disposed on lead electrodes in the housing, the interior of the housing being filled with the embedding/protecting material of claim 5 in the cured state.

* * * * *